United States Patent
Brandl et al.

(10) Patent No.: US 11,636,054 B2
(45) Date of Patent: Apr. 25, 2023

(54) MEMORY CONTROLLER POWER STATES

(71) Applicant: Advanced Micro Devices, Inc., Santa Clara, CA (US)

(72) Inventors: Kevin M. Brandl, Austin, TX (US); Indrani Paul, Austin, TX (US); Jean J. Chittilappilly, Maynard, MA (US); Abhishek Kumar Verma, Round Rock, TX (US); James R. Magro, Lakeway, TX (US); Kavyashree Pilar, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/219,273

(22) Filed: Mar. 31, 2021

(65) Prior Publication Data
US 2022/0318161 A1    Oct. 6, 2022

(51) Int. Cl.
*G06F 1/3234*    (2019.01)
*G06F 13/16*    (2006.01)
*G11C 11/406*    (2006.01)
*G06F 1/3296*    (2019.01)
*G06F 3/06*    (2006.01)

(52) U.S. Cl.
CPC ........ *G06F 13/1668* (2013.01); *G06F 1/3243* (2013.01); *G06F 1/3275* (2013.01); *G06F 1/3296* (2013.01); *G06F 3/0625* (2013.01); *G11C 11/40615* (2013.01)

(58) Field of Classification Search
None
See application file for complete search history.

(56) References Cited

U.S. PATENT DOCUMENTS

| | | | | |
|---|---|---|---|---|
| 6,134,167 | A * | 10/2000 | Atkinson | G11C 11/40626 365/222 |
| 9,052,899 | B2 * | 6/2015 | Thomas | G06F 1/3237 |
| 9,304,579 | B2 * | 4/2016 | Ware | G06F 3/0673 |
| 9,383,802 | B1 | 7/2016 | Tan et al. | |
| 10,817,043 | B2 * | 10/2020 | Jayavant | G06F 1/3278 |
| 2009/0204831 | A1 * | 8/2009 | Cousson | G06F 1/3203 713/322 |
| 2010/0162020 | A1 * | 6/2010 | Maule | G11C 5/14 711/E12.083 |

(Continued)

OTHER PUBLICATIONS

International Search Report and Written Opinion for International Application No. PCT/US2022/020930, dated Jul. 1, 2022, 8 pages.

Primary Examiner — Michael Sun
(74) Attorney, Agent, or Firm — Polansky & Associates, P.L.L.C.; Paul J. Polansky; Nathan H. Calvert

(57) ABSTRACT

A memory controller includes a command queue and an arbiter operating in a first voltage domain, and a physical layer interface (PHY) operating in a second voltage domain. The memory controller includes isolation cells operable to isolate the PHY from the first voltage domain. A local power state controller, in response to a first power state command, provides configuration and state data for storage in an on-chip RAM memory, causes the memory controller to enter a powered-down state, and maintains the PHY in a low-power state in which the second voltage domain is powered while the memory controller is in the powered-down state.

20 Claims, 5 Drawing Sheets

(56) References Cited

U.S. PATENT DOCUMENTS

| | | | |
|---|---|---|---|
| 2013/0083611 A1* | 4/2013 | Ware | G11C 11/4076 |
| | | | 365/191 |
| 2013/0318311 A1 | 11/2013 | Heo et al. | |
| 2014/0321227 A1 | 10/2014 | Syed et al. | |
| 2018/0046231 A1* | 2/2018 | Raghu | G06F 3/0653 |
| 2021/0049062 A1 | 2/2021 | Balakrishnan et al. | |

\* cited by examiner

MEMORY CONTROLLER POWER STATES

BACKGROUND

Computer systems typically use inexpensive and high density dynamic random access memory (DRAM) chips for main memory. Most DRAM chips sold today are compatible with various double data rate (DDR) DRAM standards promulgated by the Joint Electron Devices Engineering Council (JEDEC). The flow of data going to and from the DRAM over a memory bus is typically managed by a memory controller. The memory controller receives memory access requests from the host system, stores them in a queue, and dispatches them to the DRAM in an order selected by an arbiter.

A memory controller and its associated DRAM memory may be put in different power modes to increase performance or reduce their power consumption. Power modes such as this are employed for many parts of a computer system, where the different modes provide different operating capacities such as processing power for a processor core, or signalling data rate for a communication bus. One popular standard for managing such power modes is the Advanced Configuration and Power Interface (ACPI), which is a power management and configuration standard for computers such personal computers (PCs) and servers. ACPI allows the computer operating system to control the amount of power each device is given by changing the devices operating mode from among a limited set of modes. For example, such changes may include changing devices' clock speeds to a higher or lower frequency, or putting devices into standby or power-off modes. While ACPI is an industry standard which provides a generalized set of controls exposed to the operating system, it does not include specific features aimed at optimizing the power consumption or performance of specific data processing systems.

Figure 1:
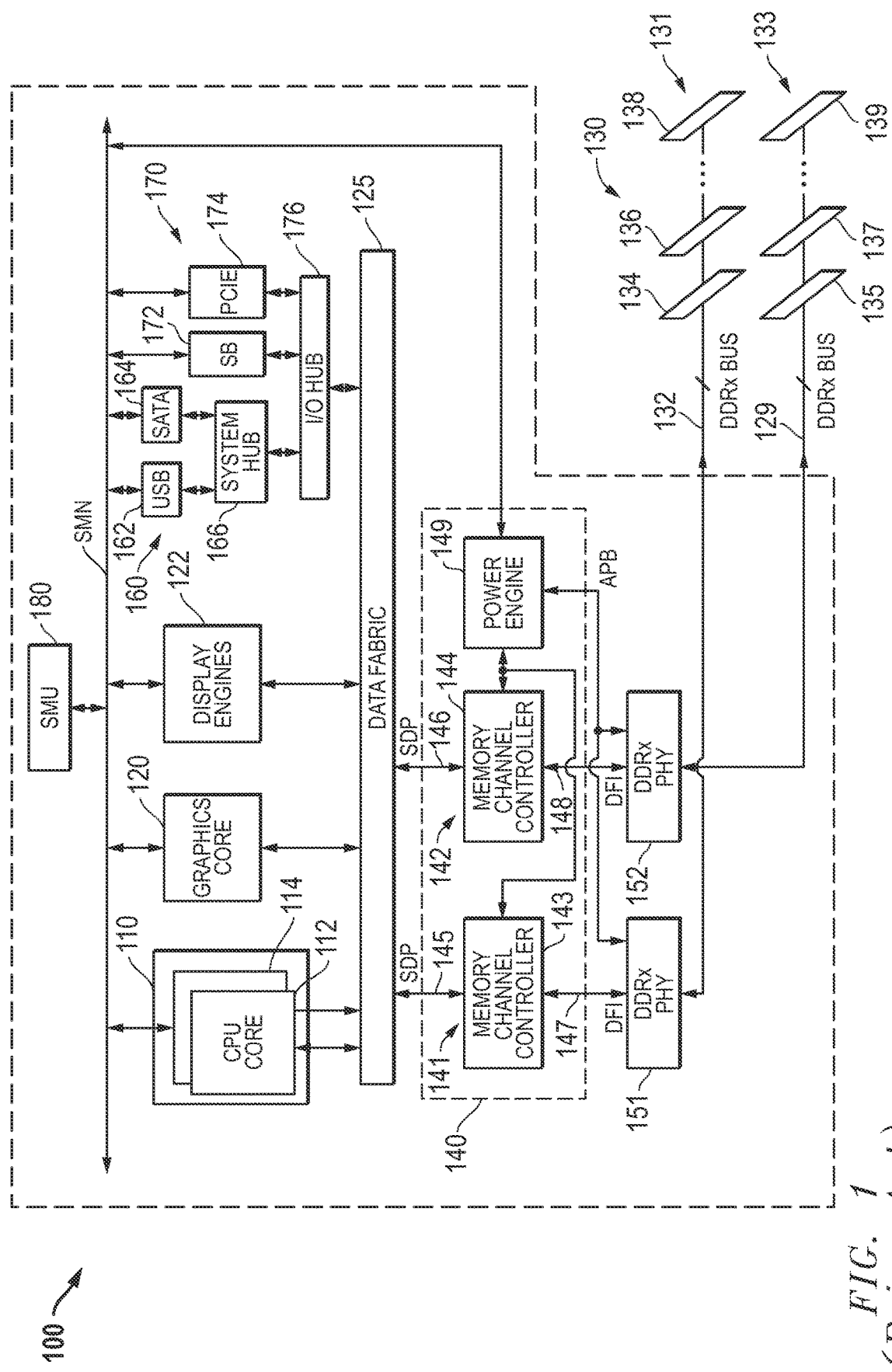
FIG. 1 illustrates in block diagram form an accelerated processing unit (APU) and memory system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory controller includes a command queue, an arbiter, a DRAM physical layer interface (PHY), and a local power state controller. The command queue receives memory access requests for a first memory channel. The arbiter selects entries from the command queue and places them in a memory interface queue causing them to be transmitted over the first memory channel. The command queue and arbiter both operate in a first voltage domain, and the DRAM PHY operates in a second voltage domain. The DRAM PHY couples the memory controller to a DRAM memory associated with the first memory channel, and includes isolation cells operable to isolate the DRAM PHY from the first voltage domain. The local power state controller, in response to a first power state command, provides configuration and state data for storage in an on-chip RAM memory, causes the memory controller to enter a powered-down state, and maintains the DRAM PHY in a low-power state in which the second voltage domain is powered while the memory controller is in the powered-down state.

A method includes, at a local power state controller of a first memory controller, receiving a first power state command, and in response, causing configuration and state data from control registers in the memory controller is stored in an on-chip RAM memory. Further in response to receiving the first power state command, the method includes causing the first memory controller to enter a powered-down state, and maintaining the PHY in a low-power state in which a second voltage domain of the PHY is powered while the first memory controller is in the powered-down state.

A data processing system includes a data fabric, a system power state controller, a first memory channel, and a first memory controller. The system power state controller is coupled to the data fabric and an on-chip RAM memory. The first memory channel is connected to an associated DRAM memory. The first memory controller is connected to the data fabric and the first memory channel for fulfilling memory access requests received over the data fabric from at least one memory accessing engine. The first memory controller includes a command queue, an arbiter, a DRAM PHY, and a local power state controller. The command queue receives memory access requests for a first memory channel. The arbiter selects entries from the command queue and places them in a memory interface queue causing them to be transmitted over the first memory channel. The command queue and arbiter both operate in a first voltage domain, and the DRAM PHY operates in a second voltage domain. The DRAM PHY couples the memory controller to the DRAM memory, and includes isolation cells operable to isolate the DRAM PHY from the first voltage domain. The local power state controller, in response to a first power state command, provides configuration and state data for storage in the on-chip RAM memory, causes the memory controller to enter a powered-down state, and maintains the DRAM PHY in a low-power state in which the second voltage domain is powered while the memory controller is in the powered-down state.

FIG. 1 illustrates in block diagram form an accelerated processing unit (APU) 100 and memory system 130 known in the prior art. APU 100 is an integrated circuit suitable for use as a processor in a host data processing system, and includes generally a central processing unit (CPU) core complex 110, a graphics core 120, a set of display engines 122, a data fabric 125, a memory management hub 140, a set of peripheral controllers 160, a set of peripheral bus controllers 170, and a system management unit (SMU) 180.

CPU core complex 110 includes a CPU core 112 and a CPU core 114. In this example, CPU core complex 110 includes two CPU cores, but in other embodiments CPU core complex 110 can include an arbitrary number of CPU cores. Each of CPU cores 112 and 114 is bidirectionally connected to a system management network (SMN), which forms a control fabric, and to data fabric 125, and is capable of providing memory access requests to data fabric 125. Each of CPU cores 112 and 114 may be unitary cores, or may further be a core complex with two or more unitary cores sharing certain resources such as caches.

Graphics core 120 is a high performance graphics processing unit (GPU) capable of performing graphics operations such as vertex processing, fragment processing, shading, texture blending, and the like in a highly integrated and parallel fashion. Graphics core 120 is bidirectionally connected to the SMN and to data fabric 125, and is capable of providing memory access requests to data fabric 125. In this regard, APU 100 may either support a unified memory architecture in which CPU core complex 110 and graphics core 120 share the same memory space, or a memory architecture in which CPU core complex 110 and graphics core 120 share a portion of the memory space, while graphics core 120 also uses a private graphics memory not accessible by CPU core complex 110.

Display engines 122 render and rasterize objects generated by graphics core 120 for display on a monitor. Graphics core 120 and display engines 122 are bidirectionally connected to a common memory management hub 140 through a data fabric 125 for uniform translation into appropriate addresses in memory system 130.

Data fabric 125 includes a crossbar switch for routing memory access requests and memory responses between any memory accessing agent and memory management hub 140. It also includes a system memory map, defined by basic input/output system (BIOS), for determining destinations of memory accesses based on the system configuration, as well as buffers for each virtual connection.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral bus controllers 170 include a system controller or "Southbridge" (SB) 172 and a Peripheral Component Interconnect Express (PCIe) controller 174, each of which is bidirectionally connected to an input/output (I/O) hub 176 and to the SMN bus. I/O hub 176 is also bidirectionally connected to system hub 166 and to data fabric 125. Thus for example a CPU core can program registers in USB controller 162, SATA interface controller 164, SB 172, or PCIe controller 174 through accesses that data fabric 125 routes through I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through the SATA interface.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 includes one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states.

Memory management hub 140 and its associated physical interfaces (PHYs) 151 and 152 are integrated with APU 100 in this embodiment. Memory management hub 140 includes memory channels 141 and 142 and a power engine 149. Memory channel 141 includes a host interface 145, a memory channel controller 143, and a physical interface 147. Host interface 145 bidirectionally connects memory channel controller 143 to data fabric 125 over a serial presence detect link (SDP). Physical interface 147 bidirectionally connects memory channel controller 143 to PHY 151, and conforms to the DDR PHY Interface (DFI) Specification for configuring PHY 151. Memory channel 142 includes a host interface 146, a memory channel controller 144, and a physical interface 148. Host interface 146 bidirectionally connects memory channel controller 144 to data fabric 125 over another SDP. Physical interface 148 bidirectionally connects memory channel controller 144 to PHY 152, and conforms to the DFI Specification. Power engine 149 is bidirectionally connected to SMU 180 over the SMN bus, to PHYs 151 and 152 over advanced peripheral bus (APB) interface 254, and is also bidirectionally connected to memory channel controllers 143 and 144. PHY 151 has a bidirectional connection to memory channel 131. PHY 152 has a bidirectional connection memory channel 133.

Memory management hub 140 is an instantiation of a memory controller having two memory channel controllers and uses a shared power engine 149 to control operation of both memory channel controller 143 and memory channel controller 144 in a manner that will be described further below. Each of memory channels 141 and 142 can connect to state-of-the-art DDR memories such as DDR version five (DDR5), DDR version four (DDR4), low power DDR4 (LPDDR4), graphics DDR version five (GDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Memory system 130 includes a memory channel 131 and a memory channel 133. Memory channel 131 includes a set of dual inline memory modules (DIMMs) connected to a DDRx bus 132, including representative DIMMs 134, 136, and 138 that in this example correspond to separate ranks. Likewise, memory channel 133 includes a set of DIMMs connected to a DDRx bus 129, including representative DIMMs 135, 137, and 139.

APU 100 operates as the central processing unit (CPU) of a host data processing system and provides various buses and interfaces useful in modern computer systems. These interfaces include two double data rate (DDRx) memory channels, a PCIe root complex for connection to a PCIe link, a USB controller for connection to a USB network, and an interface to a SATA mass storage device.

APU 100 also implements various system monitoring and power saving functions. In particular one system monitoring function is thermal monitoring. For example, if APU 100 becomes hot, then SMU 180 can reduce the frequency and voltage of CPU cores 112 and 114 and/or graphics core 120. If APU 100 becomes too hot, then it can be shut down entirely. Thermal events can also be received from external sensors by SMU 180 via the SMN bus, and SMU 180 can reduce the clock frequency and/or power supply voltage in response.

Figure 2:
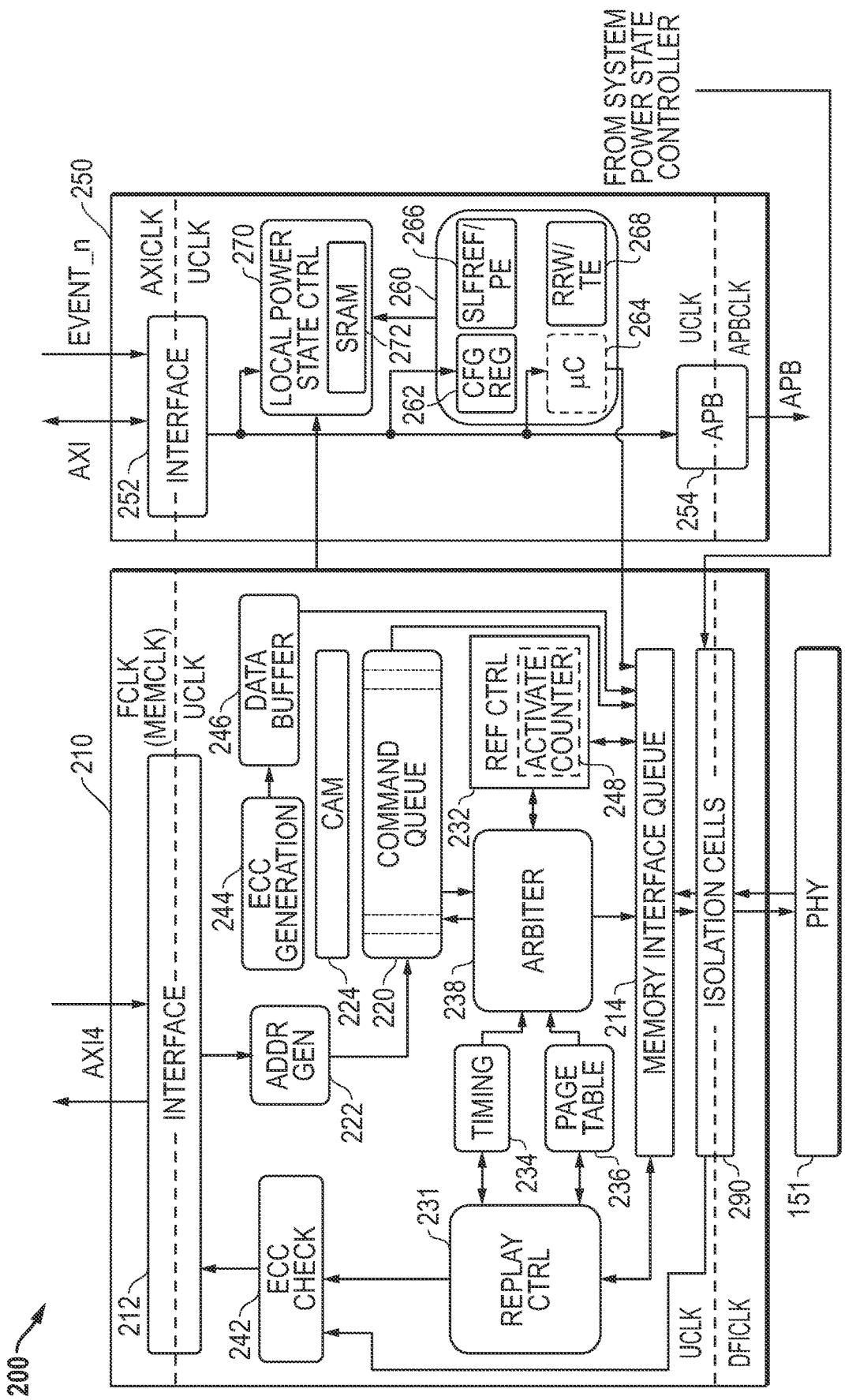
FIG. 2 illustrates in block diagram form a memory controller suitable for use in an APU like that of FIG. 1 according to some embodiments.

FIG. 2 illustrates in block diagram form a memory controller 200 that is suitable for use in an APU like that of FIG. 1. Memory controller 200 includes generally a memory channel controller 210 and a power controller 250. Memory channel controller 210 includes generally an interface 212, a memory interface queue 214, a command queue 220, an address generator 222, a content addressable memory (CAM) 224, replay control logic 231, a refresh control logic block 232, a timing block 234, a page table 236, an arbiter 238, an error correction code (ECC) check circuit 242, an ECC generation block 244, a data buffer 246, refresh control logic 232, and isolation cells 290.

Interface 212 has a first bidirectional connection to data fabric over an external bus, and has an output. In memory controller 200, this external bus is compatible with the advanced extensible interface version four specified by ARM Holdings, PLC of Cambridge, England, known as "AXI4", but can be other types of interfaces in other embodiments. Interface 212 translates memory access requests from a first clock domain known as the FCLK (or MEMCLK) domain to a second clock domain internal to memory controller 200 known as the UCLK domain. Similarly, memory interface queue 214 provides memory accesses from the UCLK domain to a DFICLK domain associated with the DFI interface.

Address generator 222 decodes addresses of memory access requests received from the data fabric over the AXI4 bus. The memory access requests include access addresses in the physical address space represented in a normalized format. Address generator 222 converts the normalized addresses into a format that can be used to address the actual memory devices in memory system 130, as well as to efficiently schedule related accesses. This format includes a region identifier that associates the memory access request with a particular rank, a row address, a column address, a bank address, and a bank group. On startup, the system BIOS queries the memory devices in memory system 130 to determine their size and configuration, and programs a set of configuration registers associated with address generator 222. Address generator 222 uses the configuration stored in the configuration registers to translate the normalized addresses into the appropriate format. Command queue 220 is a queue of memory access requests received from the memory accessing agents in APU 100, such as CPU cores 112 and 114 and graphics core 120. Command queue 220 stores the address fields decoded by address generator 222 as well other address information that allows arbiter 238 to select memory accesses efficiently, including access type and quality of service (QoS) identifiers. CAM 224 includes information to enforce ordering rules, such as write after write (WAW) and read after write (RAW) ordering rules.

Error correction code (ECC) generation block 244 determines the ECC of write data to be sent to the memory. This ECC data is then added to the write data in data buffer 246. ECC check circuit 242 checks the received ECC against the incoming ECC. ECC check circuit 242 has an input connected PHY 151 through isolation cells 290 for receiving incoming read data responsive to read requests, and an output connected to memory interface queue for providing the read data after ECC checks have passed or correctable errors have been corrected. ECC check circuit 242 also includes other connections (not shown) to signal errors responsive to ECC check failures.

Replay queue 230 is a temporary queue for storing selected memory accesses picked by arbiter 238 that are awaiting responses, such as address and command parity responses. Replay control logic 231 accesses ECC check circuit 242 to determine whether the returned ECC is correct or indicates an error. Replay control logic 231 initiates and controls a replay sequence in which accesses are replayed in the case of a parity or ECC error of one of these cycles. Replayed commands are placed in the memory interface queue 214.

Refresh control logic 232 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh control logic 232 generates refresh commands periodically and in response to designated conditions to prevent data errors caused by leaking of charge off storage capacitors of memory cells in DRAM chips. Refresh control logic 232 includes an activate counter 248, which in this embodiment has a counter for each memory region which counts a rolling number of activate commands sent over the memory channel to a memory region. The memory regions are memory banks in some embodiments, and memory sub-banks in other embodiments as further discussed below. In addition, refresh control logic 232 periodically calibrates ZQ to prevent mismatch in on-die termination resistance due to thermal changes in the system.

Arbiter 238 is bidirectionally connected to command queue 220 and is the heart of memory channel controller 210, performing intelligent scheduling of accesses to improve the usage of the memory bus. In this embodiment, arbiter 238 includes a bank group tracking circuit 235 for tracking the bank group numbers of a number of recently issued write commands, and "masking" those bank groups by preventing dispatch of commands to them for a designated period of time under certain conditions, as further described below. Arbiter 238 uses timing block 234 to enforce proper timing relationships by determining whether certain accesses in command queue 220 are eligible for issuance based on DRAM timing parameters. For example, each DRAM has a minimum specified time between activate commands, known as "$t_{RC}$". Timing block 234 maintains a set of counters that determine eligibility based on this and other timing parameters specified in the JEDEC specification, and is bidirectionally connected to replay control logic 231. Page table 236 maintains state information about active pages in each bank and rank of the memory channel for arbiter 238, and is bidirectionally connected to replay control logic 231.

In response to write memory access requests received from interface 212, ECC generation block 244 computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Memory channel controller 210 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers 262 store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as quality of service (QoS) requirements. For example, arbiter 238 implements a preference for accesses to open pages to avoid the overhead of precharge and activation commands required to change memory pages, and hides overhead accesses to one bank by interleaving them with read and write accesses to another bank. In particular during normal operation, arbiter 238 normally keeps pages open in different banks until they are required to be precharged prior to selecting a different page. Arbiter 238, in some embodiments, determines eligibility for command selection based on at least on respective values of activate counter 248 for target memory regions of the respective commands.

Isolation cells 290 have a bidirectional link to memory interface queue 214, a bidirectional link to PHY 151, and an input connected to the system power state controller 302 (FIG. 3) over the SMN, or through a sideband connection directly to the system power state controller. Each isolation cell includes a digital clamp circuit such as an AND gate or OR gate connected between a respective connection of memory interface queue 214 to PHY 151. To prevent corruption of the PHY clock and power domain signals when memory channel controller 210 is in a powered-down state and PHY 151 is in a powered state, isolation cells 290 are activated by system power state controller 302 to clamp the value of connections to a desired level (high or low).

Power controller 250 generally includes an interface 252 to an advanced extensible interface, version one (AXI), advanced peripheral bus (APB) interface 254, a power engine 260, and a local power state controller 270. Interface 252 has a first bidirectional connection to the SMN, which includes an input for receiving an event signal labeled "EVENT n" shown separately in FIG. 2, and an output. APB interface 254 has an input connected to the output of interface 252, and an output for connection to a PHY over the APB.

Power engine 260 has a bidirectional connection to interface 252, an output connected to an input of memory interface queue 214, and a bidirectional connection to local power state controller 270. Power engine 260 includes a set of configuration registers 262, a microcontroller (μC) 264, a self refresh controller (SLFREF/PE) 266, and a reliable read/write timing engine (RRW/TE) 268. Configuration registers 262 are programmed over the AXI bus, and store configuration information to control the operation of various blocks in memory controller 200 in a selected one of limited number of different power states. SLFREF/PE 266 is an engine that allows the manual generation of refreshes in addition to the automatic generation of refreshes by refresh control logic 232. Reliable read/write timing engine 268 provides a continuous memory access stream to memory or I/O devices for such purposes as DDR interface maximum read latency (MRL) training and loopback testing.

Local power state controller 270 has a bidirectional connection to interface 252, a bidirectional connection to power engine 260, and a bidirectional connection to memory channel controller 210. Local power state controller 270 includes local static ram (SRAM) memory 272 employed in saving configuration and state data for various low power and idle states supported by memory controller 200. Generally, local power state controller 270 is a programmable hardware sequencer including a local SRAM 272 with instruction RAM and data RAM. Local power state controller is employed in accelerating power state changes of memory controller 200 that include powering down one or more power domains, as further described below. Local power state controller has read and write access to all configuration data in configuration registers 262 such that it can quickly save and restore the data. It also has ability to control various logic blocks and circuits in memory controller 200 such as the various depicted logic blocks, and clock and power supply circuits. Local power state controller also has ability to send commands to PHY 151 for managing power states. While in this embodiment, local power state controller 270 is a separate hardware sequencer from μC 264, in other embodiments the functionality of these two blocks may be combined in a single programmable hardware sequencer.

In operation, power controller 250 receives power state commands such as ACPI processor state commands from SMU 180 (FIG. 1), and in response changes the power state of memory controller 200 and the attached DRAM(s) to enter a new power state, which typically includes a different clock speed for the DFICLK domain and the UCLK domain. For ACPI power states, μC 264 controls the transition of memory controller 200 to enter and exit the power states responsive to commands from SMU 180. For various other power states, local power state controller 270 performs functions to transition memory controller 200 in and out of low power states in coordination with a system power state controller (302, FIG. 3). The low power states employed differ from the various Advanced Configuration and Power Interface (ACPI) processor states and performance states, as defined in the ACPI specifications, in that they are additional power states which are typically not exposed to the operating system or controllable under the ACPI specification through its Operating System-directed configuration and Power Management (OSPM) system. Power states controlled by local power state controller 270 include memory controller idle states and "deep idle" states (which include powering down designated circuit blocks) that are coordinated with power states of other blocks in APU 100 by system power state controller 302, as further described below.

Because memory controller 200 is involved in restoring other blocks of APU 100 from low power states by accessing DRAM to save and restore configuration data, providing a low latency entry and exit for memory controller 200 allows faster overall power state adjustments for other parts of the system. This improved speed allows low power states such as idle states and "deep idle" states to remain active for longer, resulting in improved power savings. In this embodiment, local power state controller 270 saves configuration and state data from configuration registers 262 and various blocks of memory controller 200 to SRAM 272, and coordinates loading of this data to an on-chip SRAM according to processes described below. While in this embodiment, isolation cells 290 are controlled by the system power state controller, but in other embodiments local power state controller 270 may directly control isolation cells 290 at designated points during power state transitions as further described below.

Figure 3:
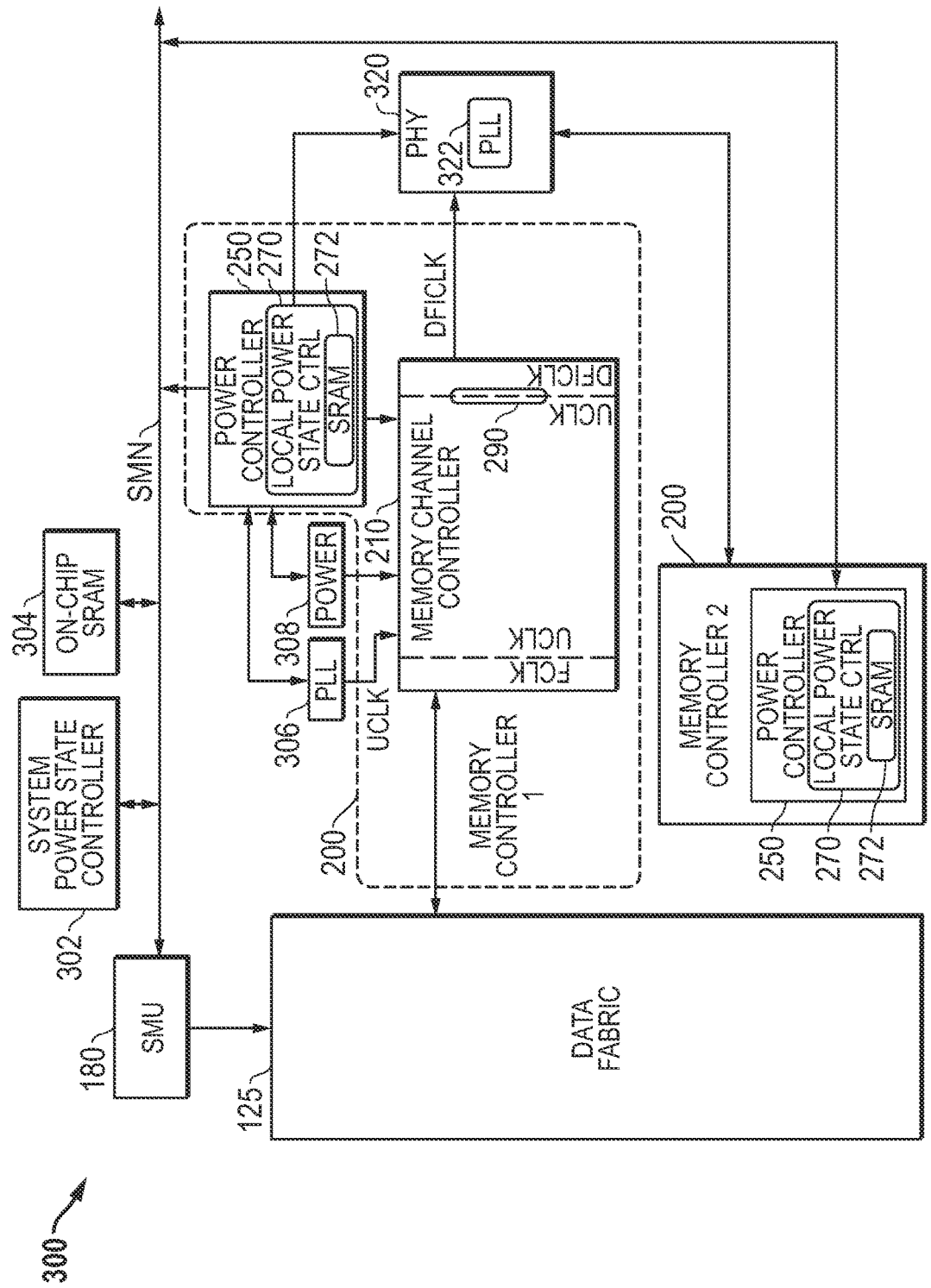
FIG. 3 illustrates in block diagram form a portion of an APU showing elements for controlling power states of memory controllers according to an exemplary embodiment.

FIG. 3 illustrates in block diagram form a portion of an APU 300 showing elements for controlling power states of memory controllers according to an exemplary embodiment. The depicted portion of APU 300 includes data fabric 125, SMU 180, a system power state controller 302, an on-chip static random access memory (SRAM) 304, the SMN, a first memory controller 200 labeled "memory controller 1", a second memory controller 200 labeled "memory controller 2", and a PHY 320. While two memory controllers 200 are shown in this embodiment, other embodiments may include more than two memory controllers, and more than one PHY.

System power state controller 302 is bidirectionally connected to the SMN for communicating with local power state controllers in various parts of APU 300 to control power states independently of ACPI power states controlled by SMU 180. System power state controller 302 may also include direct, sideband connections to specific circuits such as isolation cells 290. While only the local power state controllers 270 of two memory controllers are shown here, various other system blocks also include local power state controllers configured to control entry and exit from power states, including saving and restoring configuration and state data for their respective system blocks in response to commands from system power state controller 302. System power state controller 302 provides two ways of saving and restoring configuration and state data, by saving to system DRAM or by saving to on-chip SRAM 304. As described below, the save and restore process for memory controllers includes saving to on-chip SRAM 304.

On-chip SRAM 304 has a bidirectional connection to the SMN for receiving configuration and state data from the local power state controllers 270 of memory controllers 200 to be stored during low power states in which portions of memory controllers 200 are powered down. While an SRAM is employed in this embodiment, any suitable form of RAM that operates with a speed on the order of SRAM speeds may be employed to save the configuration and state data. In other embodiments, on-chip SRAM 304 is connected to data fabric 125 rather than the SMN. However, using the SMN allows the data fabric to be powered down or idled in various modes while still allowing quick access to on-chip SRAM 304 for reloading the data upon leaving the power state.

In this embodiment, each memory controller 200 is an instantiation of the design of FIG. 2, and includes memory channel controller 210 and power controller 250 as shown in FIG. 2. A phase-locked loop (PLL) 306 provides a clock signal UCLK for the memory controller clock domain in which the logic circuits of memory channel controller 210 operate. Various clock gating functions may also be employed to gate the UCLK signal for blocks within the UCLK domain such that some blocks are operational while others are not in various low power states and idle states. Power controller 250 is connected to PLL 306 for controlling the frequency of the UCLK signal to implement power states and idle states. A local power supply 308 provides the power for memory channel controller 210. Power controller 250 is also connected to local power supply 308 for controlling the power supply voltage to memory channel controller 210 to implement power states and idle states.

Each memory controller 200 is connected to PHY 320 for providing the APU access to DRAM memory connected to PHY 320. Isolation cells 290 are activated to isolate memory controller 200 from PHY 320 during power states in which the memory controller is powered down, and remove the isolation when exiting such a power state. Typically, each memory controller 200 controls one DDRx memory channel or subchannel, although dual-channel memory controllers may be used which control two channels. PHY 320 includes a PLL 322 for providing a clock signal based on a desired frequency for the DFICLK domain on which the PHY operates. Power controller 250 is able to adjust the frequency of the DFICLK domain to implement power states and idle states as further described below.

Each local power state controller 270 has a bidirectional connection to system power state controller 302 for receiving power state commands and sending responses and synchronization signals, as further described below. Each local power state controller includes a local SRAM 272 as described with respect to FIG. 2.

Figure 4:
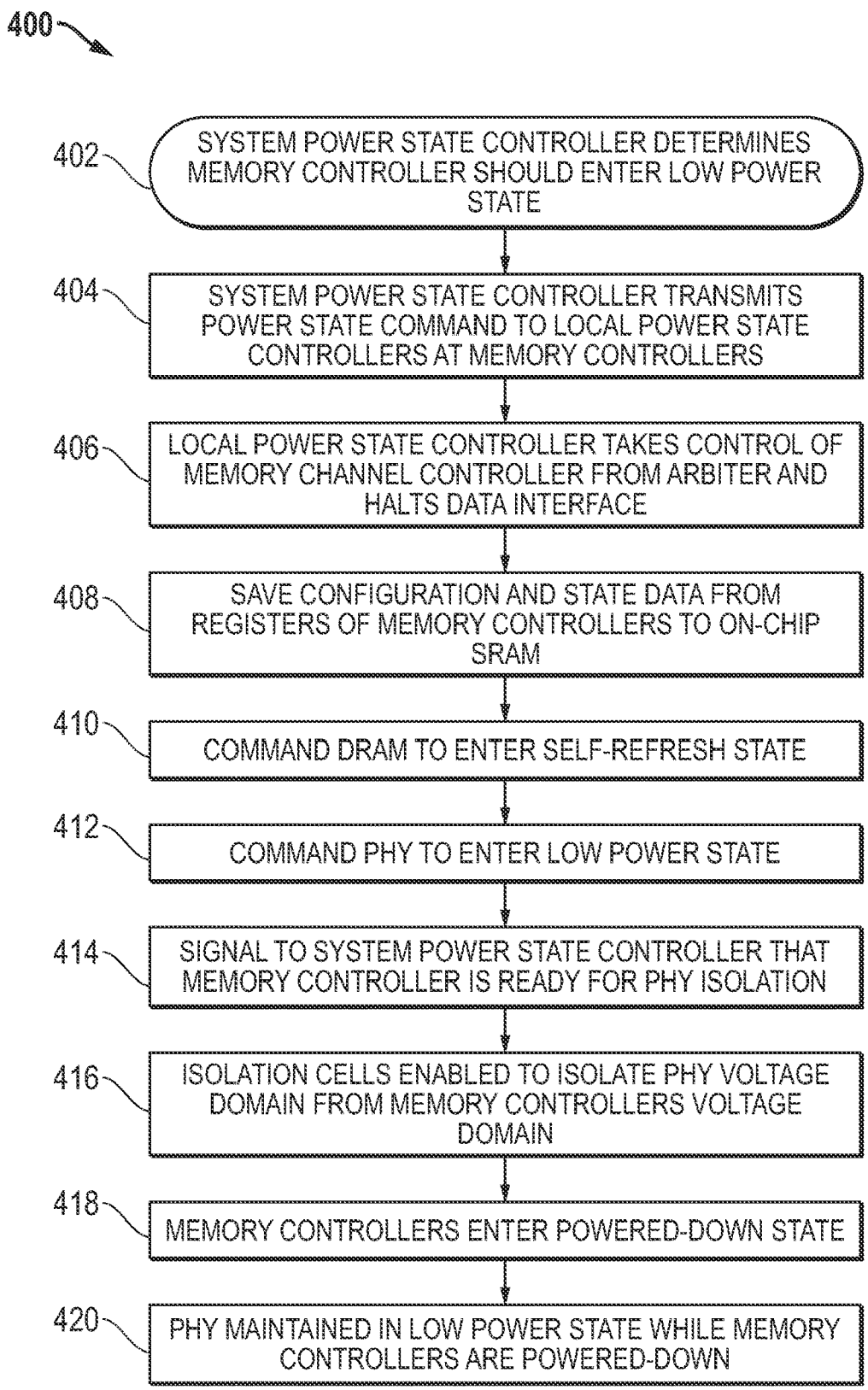
FIG. 4 shows a flowchart a process for operating a memory controller to enter low power states according to an exemplary embodiment.

FIG. 4 shows a flowchart 400 of a process for operating a memory controller to enter low power states according to an exemplary embodiment. The process is suitable for use with with APU 300 of FIG. 3, and other data processing systems including a local power state controller. The process is employed each time system power state controller 302 determines that the memory controller should enter an idle power state or other low power state controlled by system power state controller 302 as shown at block 402. This determination is typically based on the system workload, and may also be based on the level of traffic through the memory channel, and other considerations. A low power state of the memory controller will often be accompanied by low power states of other system elements such as data fabric 125, for example.

At block 404, system power state controller 302 transmits a power state command to the local power state controllers 270 at each memory controller 200. Typically, all memory controllers 200 in the system will be commanded to enter a particular power state, but the power state command may be sent to fewer than all of the memory controllers in particular situations. Preferably, several different power modes are supported which include different idle levels and "deep idle" levels for various logic blocks throughout APU 100.

At block 406, the local power state controller responds to the power state command and begins the process of changing the power state of memory controller. This includes taking control of memory channel controller 210 from arbiter 238 which typically directs the memory channel controller during normal operation. Then interface 212 is halted to stop new incoming commands from being passed from data fabric 125. This step typically includes signaling a coherent slave agent which is dedicated to memory controller 200 on data fabric 125 to inform the coherent slave agent that interface 212 is being halted.

At block 408, continuing the activity responsive to the power state command, the local power state controllers 270 save configuration and state data for the memory controller to on-chip SRAM 304 (FIG. 3). The saved data includes current configuration and state data that is lost when powering-down the memory channel controller. The saved state data may also include contents of queues and registers that are lost when powering-down the memory channel controller, and sequences of commands for μC 264 to execute to command the DRAM for various operations. In this embodiment, the save process includes first reading the configuration and state data from memory controller registers and circuit blocks and loading it to local SRAM 272 under control of local power state controller 270. Then the data is sent to on-chip SRAM 304 for storage during the low power state, allowing local SRAM 272 to be powered down. The use of on-chip SRAM to save this data allows the data to be reloaded and the memory channel controller to resume operation swiftly when leaving the low power state. The block 408 is typically performed under control of local power state controller 270 accessing the on-chip SRAM 304 over the SMN. System power state controller 302 reads the data from local SRAM 272 in some embodiments.

At block 410, the DRAM associated with each respective memory channel controller is commanded to enter a self-refresh state. Then at block 412, the PHY is commanded to enter a low power state. In some embodiments using DDR5 DRAM, the low power state employed at block 410 is the "low power 2" state. In embodiments employing other DDRx DRAM or other types of memory modules such as HBM modules, other low power states can be used.

Next, at block 414, local power state controller 270 signals to system power state controller 302 that the memory controller is ready for the PHY to be isolated. In this embodiment, the signaling is performed by writing to a register at system power state controller 302, but any suitable signaling method may be used. At this point, system power state controller 302 has ability to abort the entry into a low power state, which might be done if conditions on data fabric 125 or other portions of the system have changed since the determination was made at block 402 to enter a low power state at the memory controller.

Once all memory controllers associated with the PHY have signaled readiness at block 414, system power state controller 302 performs block 416. At block 416, system power state controller 302 enables isolation cells 290 at each memory controller to isolate the memory channel controller from the PHY. Isolation cells 290 prevent spurious signals that may occur during power-down or power-up of the memory channel controller from adversely affecting the PHY. In some embodiments, local power state controller 270 controls isolation cells 290. However, the use of a direct connection from system power state controller 302 allows the local power state controller to also be powered-down during low-power modes of the memory controller.

After the PHY is isolated from the memory channel controller at block 416, the power state controllers at each memory controller cause the memory controller to enter a powered-down state at block 418. The UCLK PLL 306 (FIG. 3) is powered off, or alternatively decoupled from various circuits within the memory channel controller using clock gating while the PLL remains powered on. In some embodiments, all UCLK signals are removed from memory channel controller 210, while in other embodiments clock gating removes the UCLK signal from significant portions of the logic in the memory channel controller. The memory channel controller local power supply 308 (FIG. 3) for the memory channel controller is deactivated or disconnected from the memory channel controller, or significant portions of the logic therein.

As shown at block 420, the PHY is maintained in the low power state that was set at block 410 while the memory controllers are in the powered-down state. The PHY is not powered down in the low power state in order to speed the process of leaving the low power state. This use of isolation cells to allow the PHY to remain powered-up but in a low power state has the advantage of avoiding a power-down of the PHY, which would add high amounts of latency to the process due to the many configuration registers and voltage levels use by the PHY, and the training and synchronization involved in powering up the PHY. The amount of power saved in the low power state is therefore increased by allowing the state to continue for a longer period without including the time needed to save configuration and state data for the PHY, power it down, reload the PHY configuration and state data, power up the PHY, and synchronize it with the memory channel controller and DRAM.

Figure 5:
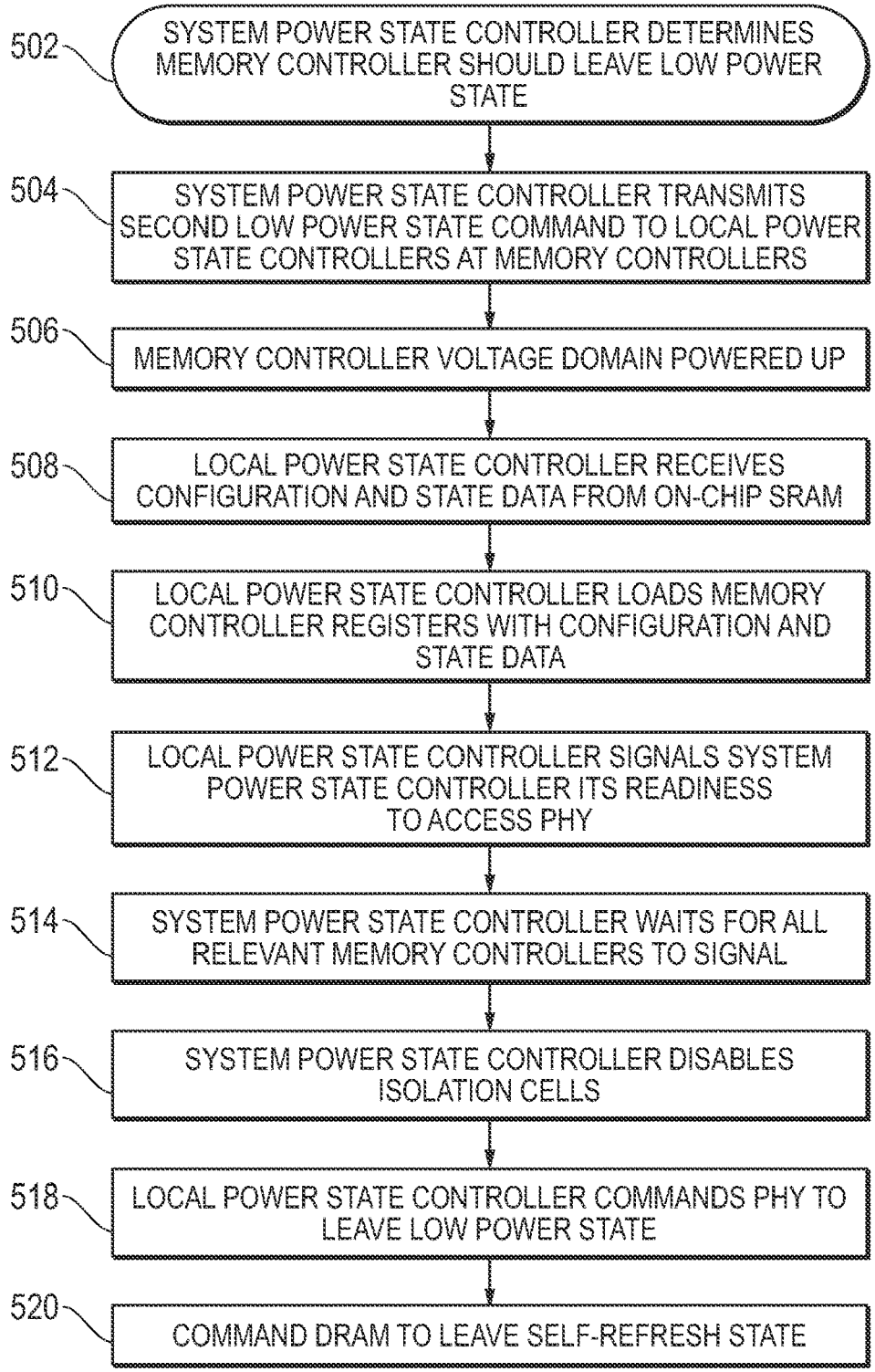
FIG. 5 shows a flowchart of a process for operating a memory controller to leave a low power state according to an exemplary embodiment.

FIG. 5 shows a flowchart 500 of a process for operating a memory controller to leave a low power state according to an exemplary embodiment. The depicted process is employed each time system power state controller 302 determines that memory controllers 200 should leave a low power state like that of FIG. 4 with a PHY which is kept active in a low power state.

At block 502, system power state controller 302 determines that the system should leave the current low power state. Similarly to the determination to enter a low power state, this determination may include various factors such as the system workload, the workload of various memory channels, the power state, and other factors. At block 504, system power state controller 302 transmits a second power state command to the local power state controllers at each memory controller, indicating that they should leave their present low power state.

In response to the second power state command, each local power state controller causes the memory controller voltage domain to be powered up at block 506. Block 506 may include reactivating the power supply to each memory channel controller, reconnecting it, or otherwise enabling power to be delivered to the various logic circuits in the memory channel controller. The process is preferably separate for each memory controller. Block 506 also includes reactivating or reconnecting the UCLK PLL to the various logic circuits that were powered down in the memory channel controller powered-down state. This block is performed by controlling the UCLK PLL and the clock gating circuitry for the memory channel controller.

At block 508, local power state controller 270 receives the configuration and state data that was saved to on-chip SRAM 304 when entering the low power state. Similarly to the process of saving the configuration and state data, block 508 is typically performed under control of the local power state controller 270 and includes accessing on-chip SRAM 304 over data fabric 125 or the SMN. Alternatively, system power state controller 302 reads the data from on-chip SRAM 304 and sends it to local power state controller 270. The data may be first saved to local SRAM 272 before being loaded into the registers and other circuits of memory controller 200.

At block 510, local power state controller 270 loads the configuration and state data into the memory controller registers and other circuits such as buffers. In some embodiments, loading the data at block 510 includes loading sequences of commands into RAM memory for µC 264.

Next, at block 512, local power state controller 270 signals to system power controller 302 that the memory controller is ready to access the PHY. In order to synchronize access to the PHY between two or more memory controllers, system power state controller 302 at block 514 waits for all the relevant memory controllers, that is all the memory controllers which will be accessing the PHY, to signal that they are ready for PHY access. Then, system power controller 302 disables the isolation cells at block 516. To accomplish this, a signal can be sent through a direct connection to the isolation cells as shown in FIG. 2, or a signal can be sent to local power state controller 270, which then controls the isolation cells.

At block 518, after the isolation cells are disabled allowing access to the PHY, local power state controller 270 commands the PHY to leave the low power state and enter a normal operating state. The operating state entered is typically the same as the PHY operating state prior to beginning the transition to a low power state.

When the PHY is operational, at block 520, the memory controller commands the DRAM associated with its memory channel to leave the self-refresh state. At this point, the transition from the low power state to a normal operating state is complete.

Memory controller 200 of FIG. 2 or any portions thereof, such as arbiter 238 and refresh control logic 232, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the internal architecture of memory channel controller 210 and/or power controller 250 may vary in different embodiments. Memory controller 200 may interface to other types of memory besides DDRx, such as high bandwidth memory (HBM), RAMbus DRAM (RDRAM), and the like. While the illustrated embodiment showed each rank of memory corresponding to separate DIMMs or SIMMs, in other embodiments each module can support multiple ranks. Still other embodiments may include other types of DRAM modules or DRAMs not contained in a particular module, such as DRAMs mounted to the host motherboard. Accordingly, it is intended by the appended claims to cover all modifications of the disclosed embodiments that fall within the scope of the disclosed embodiments.

What is claimed is:

1. A memory controller, comprising:
   a command queue for receiving memory access requests for a first memory channel, and an arbiter for selecting entries from the command queue for transmission over the first memory channel, the command queue and arbiter operating in a first voltage domain;
   a DRAM physical layer interface (PHY) operating in a second voltage domain for coupling the memory controller to a DRAM memory associated with the first memory channel;
   a local power state controller which, in response to a first power state command, provides configuration and state data for storage in an on-chip RAM memory; and
   isolation cells operable to isolate the DRAM PHY from the first voltage domain, wherein the local power state controller, in response to the first power state command, provides a signal indicating readiness for the isolation cells to isolate the DRAM PHY from the first voltage domain.

2. The memory controller of claim 1, wherein the local power state controller, in response to the first power state command, causes the memory controller to enter a powered-down state, and maintains the DRAM PHY in a low-power state in which the second voltage domain is powered while the memory controller is in the powered-down state.

3. The memory controller of claim 2, wherein the local power state controller causes the DRAM memory associated with the first memory channel to enter a self-refresh state before providing the signal indicating readiness for the isolation cells to isolate the DRAM PHY.

4. The memory controller of claim 2, wherein the local power state controller, in response to a second power state command, receives the configuration and state data from the on-chip RAM memory, causes the memory controller to leave the powered-down state and loads control registers of the memory controller with the configuration and state data, transmits a first synchronization signal to a system power state controller indicating readiness to access the DRAM PHY, and following a deactivation of isolation cells, causes the DRAM PHY to leave the low-power state.

5. The memory controller of claim 4, further comprising:
   a memory operation array programmable to store sequences of commands for the DRAM memory associated with the first memory channel that initiate entry into and exit from supported low power modes for the DRAM memory; and
   wherein the local power state controller further saves one or more of the sequences of commands to the on-chip RAM memory in response to the first power state command, and restores the one or more sequences of commands to the memory operation array in response to the second power state command.

6. The memory controller of claim 1, wherein:
   the local power state controller receives the first power state command from a system power state controller and provides the signal indicating readiness for the isolation cells to isolate the DRAM PHY to the system power state controller; and
   the isolation cells receive a signal from the system power state controller causing them to isolate the DRAM PHY from the first voltage domain.

7. The memory controller of claim 6, wherein the on-chip RAM memory is an SRAM memory accessible by the system power state controller.

8. A method, comprising:
   at a local power state controller of a first memory controller, receiving a first power state command;
   in response to receiving the first power state command:
     causing configuration and state data from control registers in the memory controller to be stored in an on-chip RAM memory;
     causing the first memory controller to enter a powered-down state in which a first voltage domain is powered down; and
     providing a signal indicating the first memory controller is ready for isolation cells in the first memory controller to isolate a physical layer interface (PHY) from the first voltage domain of the first memory controller.

9. The method of claim 8, further comprising, in response to receiving the first power state command, maintaining the PHY in a low-power state in which a second voltage domain of the PHY is powered while the first memory controller is in the powered-down state.

10. The method of claim 9, further comprising:
    at the local power state controller of the first memory controller, receiving a second power state command;
    in response to the second power state command:
      receiving the configuration and state data from the on-chip RAM memory;
      causing the first memory controller to leave the powered-down state and loading the control registers with the configuration and state data;
      transmitting a first synchronization signal indicating readiness to access the PHY; and
      following a deactivation of isolation cells in the first memory controller, causing the PHY to leave the low-power state.

11. The method of claim 8, wherein:
the local power state controller receives the first power state command from a system power state controller and provides the signal indicating readiness for isolation cells to isolate the PHY to the system power state controller; and
the isolation cells receive a signal from the system power state controller causing them to isolate the PHY from the first voltage domain.

12. The method of claim 11, further comprising:
at a second memory controller for a second DRAM memory, transmitting a second synchronization signal from the second memory controller to the system power state controller indicating readiness to access the PHY; and
disabling isolation cells of the second memory controller to allow the second memory controller to access the PHY.

13. The method of claim 10, further comprising:
storing in a memory operation array different sequences of commands for a DRAM memory that initiate entry into and exit from supported low power modes for the DRAM memory; and
saving one or more of the sequences of commands to the on-chip RAM memory in response to the first power state command, and restoring the one or more sequences of commands to the memory operation array in response to the second power state command.

14. A data processing system, comprising:
a data fabric;
a first memory channel coupled to an associated DRAM memory; and
a first memory controller coupled to the data fabric and the first memory channel for fulfilling memory access requests received over the data fabric, the first memory controller comprising:
 a command queue for receiving memory access requests for a first memory channel, and an arbiter for selecting entries from the command queue for transmission over the first memory channel, the command queue and arbiter operating in a first voltage domain;
 a DRAM physical layer interface (PHY) operating in a second voltage domain for coupling the first memory controller to a DRAM memory associated with the first memory channel;
 a local power state controller which, in response to a first power state command, provides configuration and state data for storage in an on-chip RAM memory; and
 isolation cells operable to isolate the DRAM PHY from the first voltage domain, wherein the local power state controller, in response to the first power state command, provides a signal indicating readiness for the isolation cells to isolate the DRAM PHY from the first voltage domain.

15. The data processing system of claim 14, wherein the local power state controller, in response to the first power state command, causes the first memory controller to enter a powered-down state, and maintains the DRAM PHY in a low-power state in which the second voltage domain is powered while the first memory controller is in the powered-down state.

16. The data processing system of claim 15, wherein the local power state controller causes the DRAM memory associated with the first memory channel to enter a self-refresh state before providing the signal indicating readiness for the isolation cells to isolate the DRAM PHY.

17. The data processing system of claim 15, wherein the local power state controller, in response to a second power state command, receives the configuration and state data from the on-chip RAM memory, causes the first memory controller to leave the powered-down state and loads control registers of the first memory controller with the configuration and state data, transmits a first synchronization signal to a system power state controller indicating readiness to access the DRAM PHY, and following a deactivation of the isolation cells, causes the DRAM PHY to leave the low-power state.

18. The data processing system of claim 17, wherein:
the local power state controller receives the first power state command from the system power state controller and provides the signal indicating readiness for the isolation cells to isolate the DRAM PHY to the system power state controller; and
the isolation cells receive a signal from the system power state controller causing them to isolate the DRAM PHY from the first voltage domain.

19. The data processing system of claim 17, further comprising a second memory controller coupled to a second memory channel and including a local power state controller and isolation cells like those of the first memory controller, wherein the second memory controller transmits a signal to the system power state controller indicating readiness for the second memory controller to access the DRAM PHY, and wherein the system power state controller disables the isolation cells of the second memory controller to allow the second memory controller to access the DRAM PHY.

20. The data processing system of claim 17, wherein
the first memory controller further comprises a memory operation array in the first memory controller programmable to store sequences of commands for the DRAM memory that initiate entry into and exit from supported low power modes for the DRAM memory, and
wherein the local power state controller of the first memory controller further saves one or more of the sequences of commands to the on-chip RAM memory in response to the first power state command, and restores the one or more sequences of commands to the memory operation array in response to the second power state command.

* * * * *